United States Patent
Yu et al.

(10) Patent No.: US 12,292,476 B2
(45) Date of Patent: May 6, 2025

(54) DIAGNOSIS DEVICE AND SYSTEM

(71) Applicant: BYD COMPANY LIMITED, Guangdong (CN)

(72) Inventors: Yilong Yu, Shenzhen (CN); Luhui Xu, Shenzhen (CN); Zhiyong Du, Shenzhen (CN); Axi Qi, Shenzhen (CN); Guangming Yang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 378 days.

(21) Appl. No.: 17/909,273

(22) PCT Filed: Aug. 24, 2020

(86) PCT No.: PCT/CN2020/110877
§ 371 (c)(1),
(2) Date: Sep. 2, 2022

(87) PCT Pub. No.: WO2021/174772
PCT Pub. Date: Sep. 10, 2021

(65) Prior Publication Data
US 2023/0086012 A1 Mar. 23, 2023

(30) Foreign Application Priority Data
Mar. 6, 2020 (CN) .......................... 202010149569.X

(51) Int. Cl.
*G01R 31/34* (2020.01)
*G01D 5/20* (2006.01)

(52) U.S. Cl.
CPC ............. *G01R 31/343* (2013.01); *G01D 5/20* (2013.01)

(58) Field of Classification Search
CPC .... G01R 31/343; G01R 31/34; G01R 31/346; G01R 23/15; G01R 31/318307; G01D 5/20; G01D 3/08; G01D 5/204; G01D 5/208
See application file for complete search history.

(56) References Cited

U.S. PATENT DOCUMENTS

| 6,191,550 B1 * | 2/2001 | Yoshihara | ................ G01D 3/08 318/648 |
| 2007/0146169 A1 * | 6/2007 | Otsuka | ............... G01D 5/24461 341/15 |
| 2009/0085508 A1 * | 4/2009 | Nagai | .................... H02P 21/22 318/605 |
| 2012/0010849 A1 | 1/2012 | Yamada | |

(Continued)

FOREIGN PATENT DOCUMENTS

| CN | 1838523 A | 9/2006 |
| CN | 101275988 A | 10/2008 |

(Continued)

OTHER PUBLICATIONS

International Search Report and Written Opinion for Application No. PCT/CN2020/110877, mailed on Dec. 2, 2020, 10 pages.

*Primary Examiner* — Akm Zakaria

(57) ABSTRACT

A device and a system for diagnosing a motor parameter are provided. The device includes a master chip, an excitation conditioning circuit, a motor resolver unit, and a sine and cosine conditioning circuit. The master chip includes a first analog-to-digital converter, a second analog-to-digital converter, a first processing unit, and a monitoring core.

18 Claims, 4 Drawing Sheets

(56) References Cited

U.S. PATENT DOCUMENTS

| | | |
|---|---|---|
| 2012/0143520 A1 | 6/2012 | Oowada |
| 2016/0087561 A1 | 3/2016 | Rho et al. |

FOREIGN PATENT DOCUMENTS

| | | |
|---|---|---|
| CN | 101719752 A | 6/2010 |
| CN | 102589602 A | 7/2012 |
| CN | 102636194 A | 8/2012 |
| CN | 103253304 A | 8/2013 |
| CN | 104246442 A | 12/2014 |
| CN | 107074272 A | 8/2017 |
| CN | 109073411 A | 12/2018 |
| CN | 109443451 A | 3/2019 |
| CN | 109639191 A | 4/2019 |
| CN | 209001864 U | 6/2019 |
| CN | 110120724 A | 8/2019 |
| CN | 110794343 A | 2/2020 |
| IN | 105763128 A | 7/2016 |
| JP | 2008-122216 A | 5/2008 |
| JP | 2008309755 A | 12/2008 |
| JP | 2010208398 A | 9/2010 |
| JP | 2011158389 A | 8/2011 |
| JP | 2012-098195 A | 5/2012 |
| JP | 2015023611 A | 2/2015 |
| JP | 2015136272 A | 7/2015 |
| JP | 2016085195 A | 5/2016 |
| JP | 2016-142693 A | 8/2016 |
| JP | 2017-067695 A | 4/2017 |
| JP | 2019047702 A | 3/2019 |
| JP | 2019110723 A | 7/2019 |
| KR | 20160041585 A | 4/2016 |

\* cited by examiner

DIAGNOSIS DEVICE AND SYSTEM

CROSS-REFERENCE TO RELATED APPLICATIONS

This application is a national phase application of International Patent Application No. PCT/CN2020/110877, filed with the China National Intellectual Property Administration (CNIPA) on Aug. 24, 2020, which is based on and claims the priority to and benefits of Chinese Patent Application 202010149569.X filed on Mar. 6, 2020 and entitled "MOTOR PARAMETER DIAGNOSIS DEVICE AND SYSTEM". The entire content of all of the above-identified applications is incorporated herein by reference.

FIELD

The present disclosure relates to the technical field of motors, and in particular, to a device and a system for diagnosing a motor parameter.

BACKGROUND

In an early development stage of new energy vehicles, a major development goal of the industry is function realization and better performance. A motor position is one of the most important input of motor control, which is usually acquired and diagnosed by an integrated chip. A diagnosis process is relatively simple, and the diagnosis accuracy is relatively low, which reduces the reliability of the subsequent safety control.

SUMMARY

Embodiments of the present disclosure provide a device and a system for diagnosing a motor parameter.

A first aspect of the embodiments of the present disclosure provides a device for diagnosing a motor parameter. The device includes a master chip, an excitation conditioning circuit, a motor resolver unit, and a sine and cosine conditioning circuit. The master chip includes a first analog-to-digital converter, a second analog-to-digital converter, a first processing unit, and a monitoring core.

The first processing unit is configured to send an excitation signal to the motor resolver unit through the excitation conditioning circuit. The motor resolver unit is configured to generate a sine analog signal and a cosine analog signal based on the excitation signal. The sine and cosine conditioning circuit is configured to process the sine analog signal and then output the sine analog signal to the first analog-to-digital converter. The sine and cosine conditioning circuit is further configured to process the cosine analog signal and then output the cosine analog signal to the second analog-to-digital converter.

The first analog-to-digital converter is configured to convert a processed sine analog signal to a sine digital signal and to send the sine digital signal to the first processing unit and the monitoring core respectively.

The second analog-to-digital converter is configured to convert a processed cosine analog signal to a cosine digital signal and to send the cosine digital signal to the first processing unit and the monitoring core respectively.

The first processing unit is further configured to obtain a first motor angle based on the sine digital signal and the cosine digital signal and to send the first motor angle to the monitoring core.

The monitoring core is configured to diagnose the sine digital signal to detect whether or not the sine digital signal is abnormal. The monitoring core is further configured to diagnose the cosine digital signal to detect whether or not the cosine digital signal is abnormal. The monitoring core is further configured to diagnose the first motor angle to detect whether or not the first motor angle is abnormal.

A second aspect of the embodiments of the present disclosure provides a system for diagnosing a motor parameter. The system includes a controller and the device in the first aspect of the embodiments of the present disclosure. The controller is configured to stop a control operation on the motor in a case that the sine digital signal is abnormal, the cosine digital signal is abnormal, or the first motor angle is abnormal.

In the embodiments of the present disclosure, the first motor angle is calculated by the first processing unit, and the first motor angle is diagnosed by the monitoring core. The calculation and the diagnosis of the first motor angle are performed separately.

BRIEF DESCRIPTION OF THE DRAWINGS

To describe the technical solutions of the embodiments of the present disclosure or the related art more clearly, the following briefly introduces the accompanying drawings required for describing the embodiments or the related art. Apparently, the accompanying drawings in the following description show only some embodiments of the present disclosure, and a person of ordinary skill in the art may still derive other drawings from these accompanying drawings without creative efforts.

DETAILED DESCRIPTION

The following clearly and completely describes the technical solutions in the embodiments of the present disclosure with reference to the accompanying drawings in the embodiments of the present disclosure. Apparently, the described embodiments are merely some of the embodiments of the present disclosure rather than all of the embodiments. All other embodiments obtained by a person of ordinary skill in the art based on the embodiments of the present disclosure without creative efforts shall fall within the protection scope of the present disclosure.

In the specification, claims, and accompanying drawings of the present disclosure, the terms such as "first" and "second" are intended to distinguish between different objects rather than indicate a particular order. In addition, the terms "include", "have", and any variant thereof are intended to cover a non-exclusive inclusion. For example, a process, method, system, product, or device that includes a series of steps or units is not limited to the listed steps or units; and instead, further optionally includes a step or unit that is not listed, or further optionally includes another step or unit that is intrinsic to the process, method, product, or device.

"Embodiment" mentioned in the present disclosure means that particular features, structures, or characteristics described with reference to the embodiment may be included in at least one embodiment of the present disclosure. The term appearing at different positions of the specification may not refer to the same embodiment. The term appearing at different positions of the specification may also not refer to an independent or alternative embodiment that is mutually exclusive with another embodiment. A person skilled in the art explicitly or implicitly understands that the embodiments described in the present disclosure may be combined with other embodiments.

Figure 1:
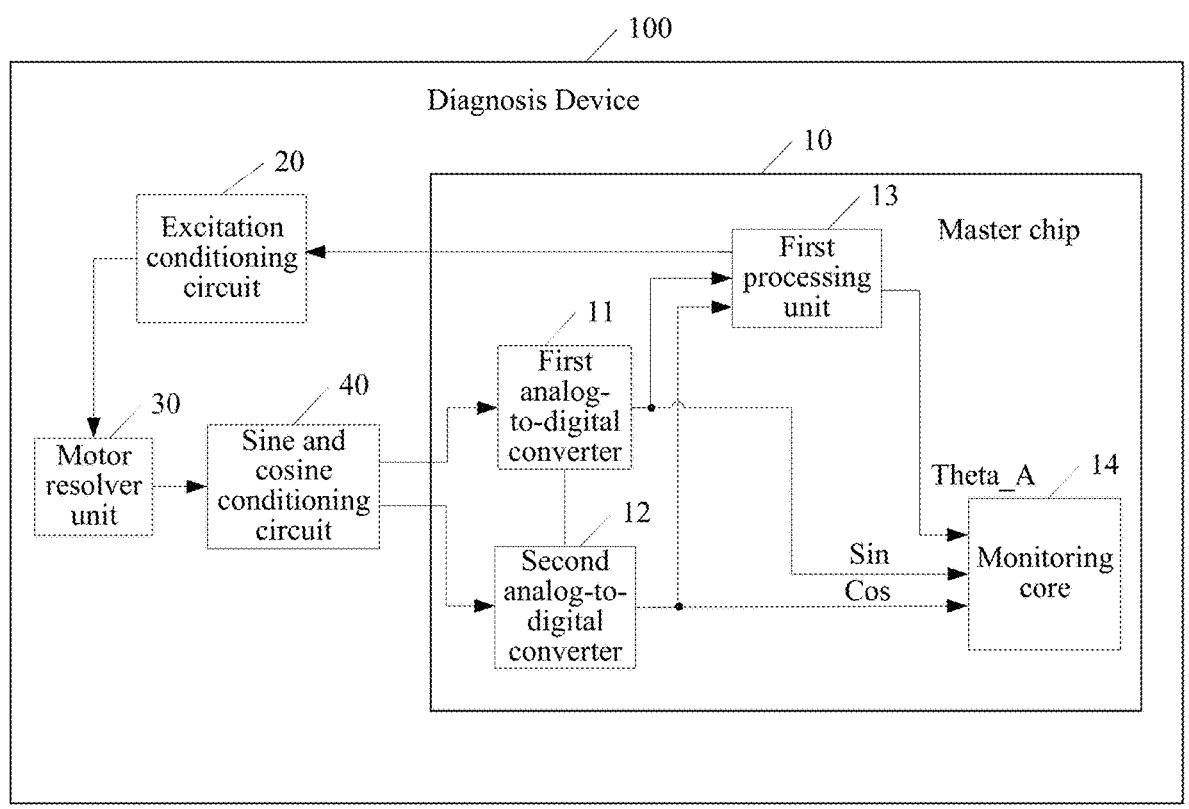
FIG. 1 is a schematic structural diagram of a device for diagnosing a motor parameter according to an embodiment of the present disclosure.

Referring to FIG. 1, FIG. 1 is a schematic structural diagram of a device for diagnosing a motor parameter according to an embodiment of the present disclosure, which can improve diagnosis accuracy of the motor parameter, thereby improving reliability of safety control. As shown in FIG. 1, the device 100 for diagnosing a motor parameter includes a master chip 10, an excitation conditioning circuit 20, a motor resolver unit 30, and a sine and cosine conditioning circuit 40. The master chip 10 includes a first analog-to-digital converter 11, a second analog-to-digital converter 12, a first processing unit 13, and a monitoring core 14.

The first processing unit 13 is configured to send an excitation signal to the motor resolver unit 30 through the excitation conditioning circuit 20.

The motor resolver unit 30 is configured to generate a sine analog signal and a cosine analog signal based on the excitation signal.

The sine and cosine conditioning circuit 40 is configured to process (for example, filter and amplify) the sine analog signal and then output the sine analog signal to the first analog-to-digital converter 11, and to process (for example, filter and amplify) the cosine analog signal and then output the cosine analog signal to the second analog-to-digital converter 12.

The first analog-to-digital converter 11 is configured to convert a processed sine analog signal to a sine digital signal and to send the sine digital signal to the first processing unit 13 and the monitoring core 14 respectively.

The second analog-to-digital converter 12 is configured to convert a processed cosine analog signal to a cosine digital signal and to send the cosine digital signal to the first processing unit 13 and the monitoring core 14 respectively.

The first processing unit 13 is further configured to obtain a first motor angle based on the sine digital signal and the cosine digital signal and to send the first motor angle to the monitoring core 14.

The monitoring core 14 is configured to diagnose the sine digital signal to detect whether or not the sine digital signal is abnormal. The monitoring core 14 is further configured to diagnose the cosine digital signal to detect whether or not the cosine digital signal is abnormal. The monitoring core 14 is further configured to diagnose the first motor angle to detect whether or not the first motor angle is abnormal.

In this embodiment of the present disclosure, as shown in FIG. 1, a first output terminal of the first processing unit 13 is connected with an input terminal of the excitation conditioning circuit 20, an output terminal of the excitation conditioning circuit 20 is connected with an input terminal of the motor resolver unit 30, and an output terminal of the motor resolver unit 30 is connected with an input terminal of the sine and cosine conditioning circuit 40. A first output terminal of the sine and cosine conditioning circuit 40 is connected with an input terminal of the first analog-to-digital converter 11, and a second output terminal of the sine and cosine conditioning circuit 40 is connected with an input terminal of the second analog-to-digital converter 12. An output terminal of the first analog-to-digital converter 11 is connected with a first input terminal of the first processing unit 13 and a first input terminal of the monitoring core 14, and an output terminal of the second analog-to-digital converter 12 is connected with a second input terminal of the first processing unit 13 and a second input terminal of the monitoring core 14. A second output terminal of the first processing unit 13 is connected with a third input terminal of the monitoring core 14.

The first processing unit 13 may send a control instruction to the excitation conditioning circuit 20 to control the excitation conditioning circuity 20 for generating an excitation (Ext) signal, and sending the excitation (Ext) signal to the motor resolver unit 30. After receiving the excitation signal, the motor resolver unit 30 generates a sine (Sin) analog signal and a cosine (Cos) analog signal. The excitation signal may be an AC voltage signal or an AC current signal. The motor resolver unit 30 may measure a rotation angle of a motor rotor, detect a position of the motor rotor, and the like.

For example, an AC excitation voltage is applied to a rotor winding of a resolver transmitter of the motor resolver unit 30, and the resolver transmitter is correspondingly connected with a stator winding of a resolver. An electromotive force proportional to a sine function of an angle difference between two rotating shafts is outputted to two terminals of a rotor winding of the resolver. When the angle difference is relatively small, the outputted electromotive force is approximately proportional to the angle difference. Therefore, a pair of resolvers may be configured to measure the rotation angle of the motor rotor.

The motor resolver unit 30 may be a sine and cosine resolver. The resolver is a precision-controlled micro-motor in automatic control devices. In terms of physical nature, the resolver may be considered as a rotatable transformer. A primary winding and a secondary winding of the transformer are respectively placed on a stator and a rotor. When an AC excitation voltage is applied to a primary side of the resolver, an output voltage of a secondary side of the resolver maintains a strict functional relationship with the rotation angle of the rotor, thereby realizing functions such as angle detection, calculation, or transmission. A voltage of an output winding of the sine and cosine resolver is sine and cosine functions of the rotation angle of the rotor.

The sine and cosine conditioning circuit 40 processes (for example, filters and amplifies) the sine analog signal and then outputs the sine analog signal to the first analog-to-digital converter 11, and processes (for example, filters and amplifies) the cosine analog signal and then outputs the cosine analog signal to the second analog-to-digital converter 12.

The first analog-to-digital converter 11 is configured to process the sine analog signal, and the second analog-to-digital converter 12 is configured to process the cosine analog signal.

The first processing unit 13 may be a co-processor adapted for specific calculations, such as a calculation of the motor angle.

The monitoring core 14 is configured to implement logic, control, and decision-making. The monitoring core 14 may be a microcontroller unit (MCU).

The master chip 10 is a chip integrated with multiple modules (the first analog-to-digital converter 11, the second analog-to-digital converter 12, the first processing unit 13, and the monitoring core 14), which can realize decoding of a motor position and diagnosis of a motor parameter.

In this embodiment of the present disclosure, the first motor angle is calculated by the first processing unit, and the first motor angle is diagnosed by the monitoring core. The calculation and the diagnosis of the first motor angle are performed separately. Since the angle calculation and the angle diagnosis can be executed independently, an execution speed is improved. The monitoring core may diagnose the sine digital signal, the cosine digital signal, and the first motor angle, to realize comprehensive diagnosis of key parameters (the sine digital signal, the cosine digital signal, and the first motor angle) of a motor, thereby improving the diagnosis accuracy of the motor parameter. Once an abnormal parameter is detected, the abnormality is processed quickly, thereby improving reliability of safety control.

In an embodiment, the sine digital signal is diagnosed by the monitoring core 14 to detect whether or not the sine digital signal is abnormal. It specifically includes: detecting, by the monitoring core 14, whether or not a difference between the sine digital signal and a preset sine digital signal threshold falls within a range of a sine signal diagnosis threshold, if not, determining that the sine digital signal is abnormal, and if so, determining that the sine digital signal is normal.

The cosine digital signal is diagnosed by the monitoring core 14 to detect whether or not the cosine digital signal is abnormal. It specifically includes: detecting, by the monitoring core 14, whether or not a difference between the cosine digital signal and a preset cosine digital signal threshold falls within a range of a cosine signal diagnosis threshold, if not, determining that the cosine digital signal is abnormal, and if so, determining that the cosine digital signal is normal.

The first motor angle is diagnosed by the monitoring core 14 to detect whether or not the first motor angle is abnormal. It specifically includes: detecting, by the monitoring core 14, whether or not a difference between the first motor angle and a preset angle threshold falls within a range of an angle diagnosis threshold, if not, determining that the first motor angle is abnormal, and if so, determining that the first motor angle is normal.

In this embodiment of the present disclosure, the preset sine digital signal threshold may correspond to the excitation signal. A different preset sine digital signal threshold may be determined based on a different excitation signal. Generally, a frequency and an amplitude of the excitation signal are constant, and the preset sine digital signal threshold is constant. The preset sine digital signal threshold may be preset and stored in a memory (such as a non-volatile memory) of the monitoring core 14.

Similarly, the preset cosine digital signal threshold may correspond to the excitation signal. A different preset cosine digital signal threshold may be determined based on a different excitation signal. Generally, a frequency and an amplitude of the excitation signal are constant, and the preset cosine digital signal threshold is constant. The preset cosine digital signal threshold may be preset and stored in the memory (such as a non-volatile memory) of the monitoring core 14.

Similarly, the preset angle threshold may correspond to the excitation signal. A different preset angle threshold may be determined based on a different excitation signal. Generally, a frequency and an amplitude of the excitation signal are fixed, and the preset angle threshold is fixed. The preset angle threshold may be preset and stored in the memory (such as a non-volatile memory) of the monitoring core 14.

The range of the sine signal diagnosis threshold is a criterion for determining whether or not the sine analog signal generated by the motor resolver unit 30 is abnormal. The range of the cosine signal diagnosis threshold is a criterion for determining whether or not the cosine analog signal generated by the motor resolver unit 30 is abnormal. The range of the angle diagnosis threshold is a criterion for determining whether or not the first motor angle calculated by the first processing unit 13 is abnormal.

The sine signal diagnosis threshold may range from $-A$ to $+A$, where A is a positive number. The cosine signal diagnosis threshold may range from $-B$ to $+B$, where B is a positive number. The angle diagnosis threshold may range from $-C$ to $+C$, where C is a positive number.

In an embodiment, the sine signal diagnosis threshold is determined based on at least one of a model of a motor, a model of a vehicle, or a scene where the vehicle is located. The cosine signal diagnosis threshold is determined based on at least one of the model of the motor, the model of the vehicle, or the scene where the vehicle is located. The angle diagnosis threshold is determined based on at least one of the model of the motor, the model of the vehicle, or the scene where the vehicle is located.

In this embodiment of the present disclosure, a different model of a motor corresponds to a different criterion for diagnosing an abnormality of a motor parameter. The monitoring core 14 may set a different threshold for a different model of a motor, and set a different threshold for a different model of a vehicle. A different scene where the vehicle is located corresponds to a different criterion for diagnosing an abnormality of a motor parameter. For example, a criterion for diagnosing an abnormality of a motor parameter on highways may be different from a criterion for diagnosing an abnormality of a motor parameter on mountain roads.

The diagnosis criterion for the motor parameter in this embodiment of the present disclosure may vary with a scene where the vehicle is located, which can improve diagnosis accuracy of the motor parameter.

In an embodiment, the monitoring core 14 is further configured to receive a revision instruction of a sine signal threshold, to receive information of the sine signal diagnosis threshold inputted by a user, and to revise the range of the sine signal diagnosis threshold according to the information of the sine signal diagnosis threshold.

In this embodiment of the present disclosure, the user may modify the range of the sine signal diagnosis threshold to satisfy requirements of the current user, thereby improving user experience.

In an embodiment, the monitoring core 14 is further configured to receive a revision instruction of a cosine signal threshold, receive information of the cosine signal diagnosis threshold inputted by a user, and revise the range of the cosine signal diagnosis threshold according to the information of the cosine signal diagnosis threshold.

In this embodiment of the present disclosure, the user may modify the range of the cosine signal diagnosis threshold to satisfy requirements of the current user, thereby improving user experience.

In an embodiment, the monitoring core 14 is further configured to receive a revision instruction of an angle threshold, to receive information of the angle diagnosis threshold inputted by a user, and to revise the range of the angle diagnosis threshold according to the information of the angle diagnosis threshold.

In this embodiment of the present disclosure, the monitoring core can execute the diagnosis independently. Therefore, the diagnosis threshold of the monitoring core may be set in real time by the outside to satisfy requirements of a current model and a current user. In this way, the scope of the application is expanded and the user experience is improved. The user may modify the range of the angle diagnosis threshold to satisfy requirements of the current user, thereby improving the user experience.

Figure 2:
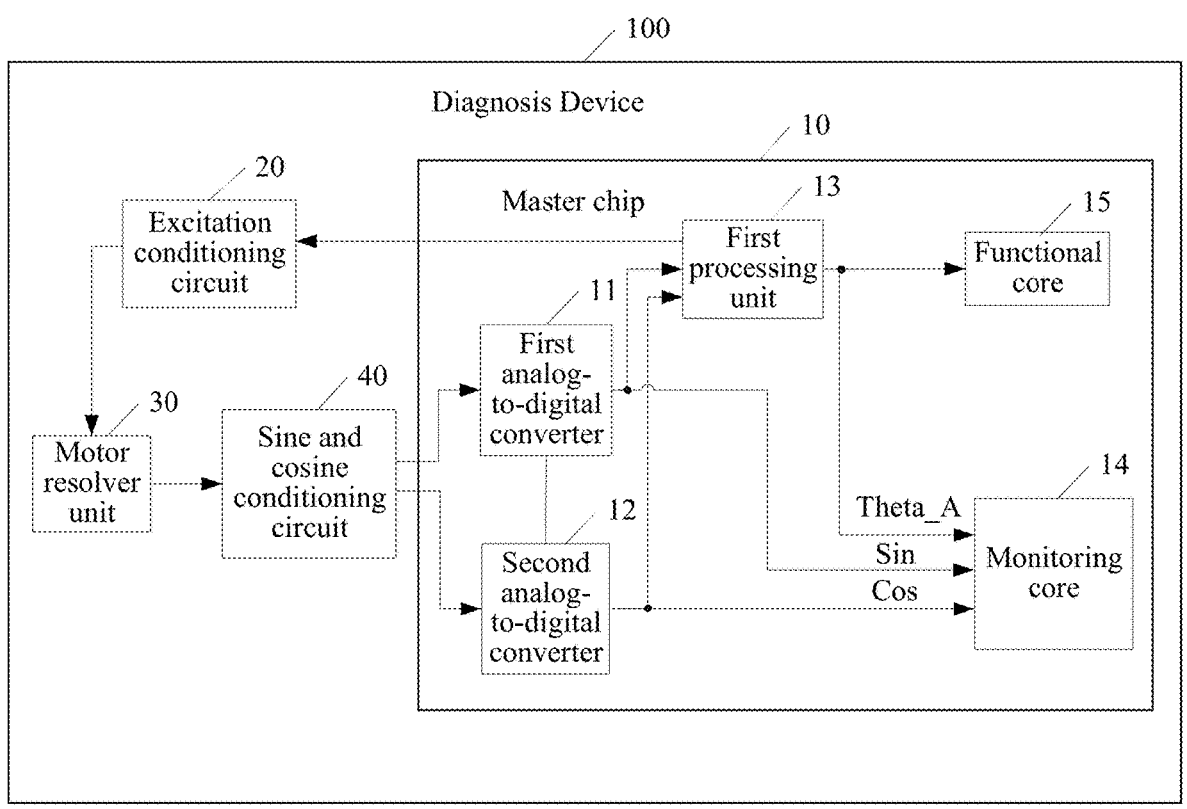
FIG. 2 is a schematic structural diagram of a device for diagnosing a motor parameter according to another embodiment of the present disclosure.

In an embodiment, referring to FIG. 2, FIG. 2 is a schematic structural diagram of a device for diagnosing a motor parameter according to another embodiment of the present disclosure. FIG. 2 is obtained by further optimization based on FIG. 1. As shown in FIG. 2, based on FIG. 1, a functional core 15 is added. The functional core 15 may be connected with the first processing unit 13.

The first processing unit 13 is further configured to send the first motor angle to the functional core 15 after obtaining the first motor angle based on the sine digital signal and the cosine digital signal.

The functional core 15 may be a chip configured to implement a specific function. The functional core 15 can implement some specific functions of the vehicle. Specifically, the functional core 15 can realize automatic control of a motor speed of the vehicle based on the first motor angle.

Figure 3:
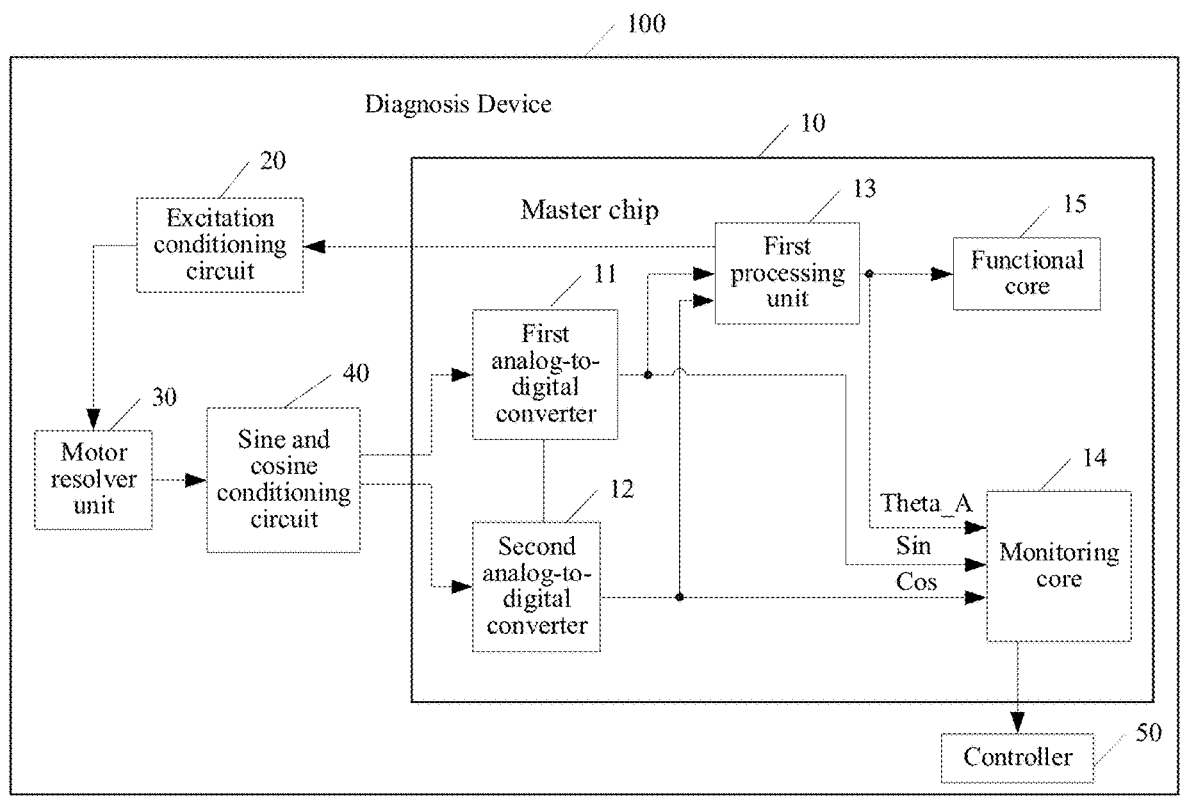
FIG. 3 is a schematic structural diagram of a device for diagnosing a motor parameter according to another embodiment of the present disclosure.

In an embodiment, referring to FIG. 3, FIG. 3 is a schematic structural diagram of a device for diagnosing a motor parameter according to another embodiment of the present disclosure. FIG. 3 is obtained by further optimization based on FIG. 2. As shown in FIG. 3, based on FIG. 2, a controller 50 is added. The controller 50 may be connected with the monitoring core 14.

When an abnormality is diagnosed by the monitoring core 14, the monitoring core 14 may transmit an abnormal signal to the controller 50, and the controller 50 may process the abnormality based on the abnormal signal. When any of the sine digital signal, the cosine digital signal, or the first motor angle is abnormal, the abnormality can be quickly processed. In this way, the reliability of safety control is improved, and a desirable single-point-of-failure coverage is realized, thereby avoiding a common cause failure.

In an embodiment, when an abnormality is diagnosed by the monitoring core 14, the monitoring core 14 may transmit the diagnosis result to other devices, so that the other devices may execute a corresponding operation according to the diagnosis result, thereby realizing the safety control. For example, if the first motor angle is diagnosed to be abnormal, the first motor angle may be transmitted to other devices that need to perform control according to the first motor angle and other devices that require to take the first motor angle as an intermediate quantity.

Figure 4:
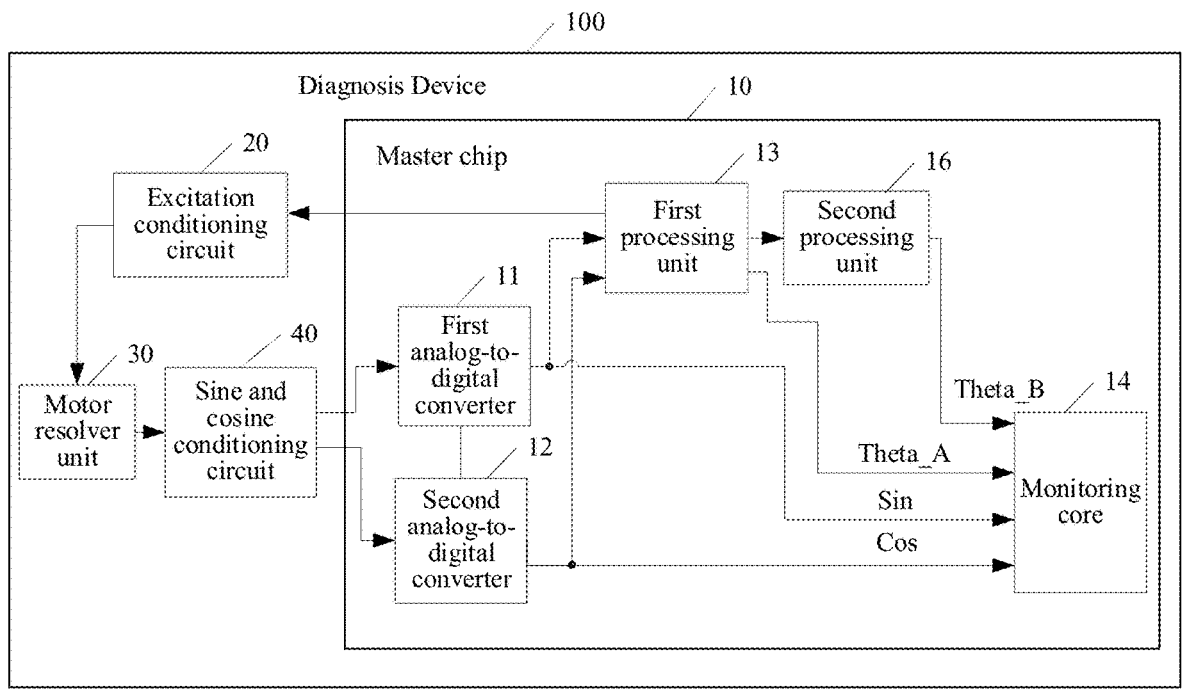
FIG. 4 is a schematic structural diagram of a device for diagnosing a motor parameter according to another embodiment of the present disclosure.

In an embodiment, referring to FIG. 4, FIG. 4 is a schematic structural diagram of a device for diagnosing a motor parameter according to another embodiment of the present disclosure. FIG. 4 is obtained by further optimization based on FIG. 1. As shown in FIG. 4, based on FIG. 1, a second processing unit 16 is added. The first processing unit 13 may be connected with the monitoring core 14 by the second processing unit 16.

An input terminal of the second processing unit 16 is connected with the second output terminal of the first processing unit 13, and an output terminal of the second processing unit 16 is connected with the third input terminal of the monitoring core 14.

The first processing unit 13 is further configured to send the first motor angle to the second processing unit 16 after obtaining the first motor angle based on the sine digital signal and the cosine digital signal.

The second processing unit 16 is configured to perform an optimal calculation on the first motor angle to obtain a more accurate second motor angle and send the second motor angle to the monitoring core 14.

The monitoring core 14 is further configured to diagnose the second motor angle to detect whether or not the second motor angle is abnormal.

In this embodiment of the present disclosure, the second processing unit may optimize the first motor angle, and optimize the angle calculation result, so as to perform more accurate control according to the optimized angle, thereby improving the control accuracy.

Specifically, the second processing unit 16 may optimize the first motor angle (for example, Theta_A) by filtering to obtain a more accurate second motor angle (for example, Theta_B). Subsequently, the second motor angle may be applied for the safety control, which leads to higher control accuracy than the first motor angle.

In an embodiment, as shown in FIG. 4, the first processing unit 13 is further configured to demodulate the first motor angle after obtaining the first motor angle based on the sine digital signal and the cosine digital signal, to obtain a demodulated signal, and send the demodulated signal to the monitoring core 14. The monitoring core 14 is further configured to diagnose the demodulated signal.

In an embodiment, the second motor angle is diagnosed by the monitoring core 14 to detect whether or not the second motor angle is abnormal. It specifically includes: detecting, by the monitoring core 14, whether or not a difference between the second motor angle and the preset angle threshold falls within the range of the angle diagnosis threshold, if not, determining that the second motor angle is abnormal, and if so, determining that the second motor angle is normal.

The range of the angle diagnosis threshold is a criterion for determining whether or not the second motor angle optimized by the second processing unit 16 is abnormal. The diagnosis of the second motor angle is similar to the diagnosis of the first motor angle.

In an embodiment, the monitoring core 14 is further configured to obtain a third motor angle based on the sine digital signal and the cosine digital signal.

The first motor angle is diagnosed by the monitoring core 14 to detect whether or not the first motor angle is abnormal. It specifically includes: detecting, by the monitoring core 14, whether or not a difference between the first motor angle and the third motor angle falls within a range of an angle diagnosis threshold, if not, determining that the first motor angle is abnormal, and if so, determining that the first motor angle is normal.

In this embodiment of the present disclosure, like the first processing unit, the monitoring core may obtain the third motor angle based on the sine digital signal and the cosine digital signal. The same angle is calculated by the two different modules, and it is determined whether or not the first motor angle is abnormal according to the difference between the angles calculated by the two different modules (if an absolute value of the difference between the angles calculated by the two different modules is greater than a first threshold, it is determined that the first motor angle is abnormal; and if the absolute value of the difference between the angles calculated by two different modules is less than the first threshold, it is determined that the first motor angle is normal). Therefore, diagnosis accuracy of the motor angle is improved, thereby improving the reliability of the safety control.

Figure 5:
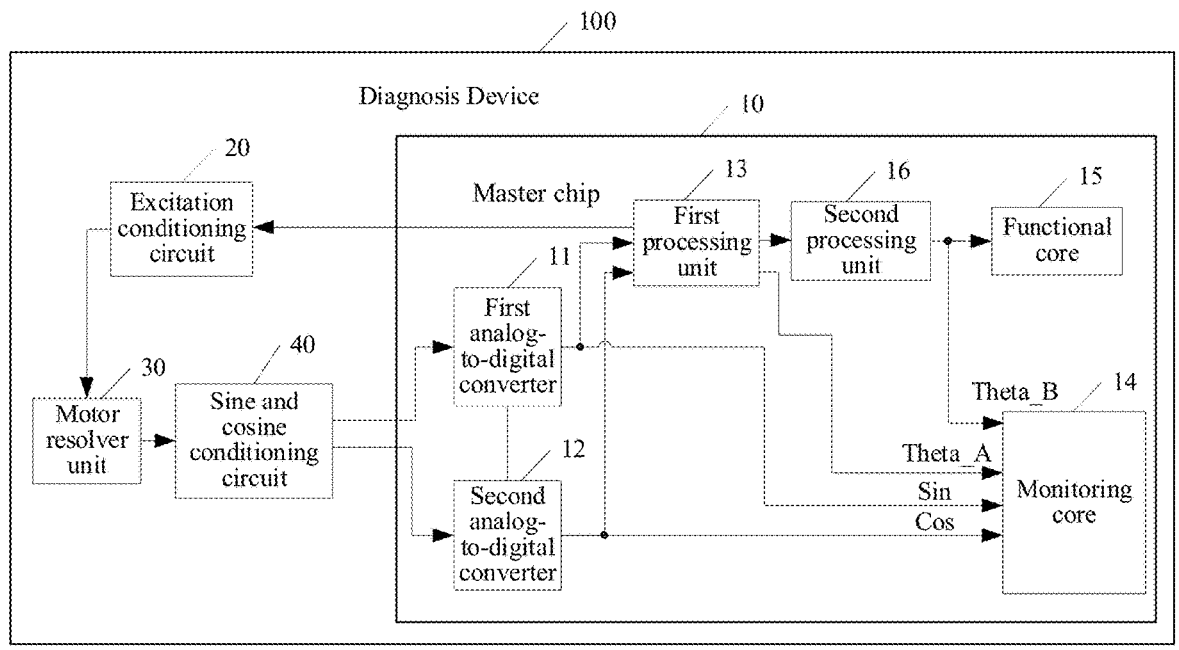
FIG. 5 is a schematic structural diagram of a device for diagnosing a motor parameter according to another embodiment of the present disclosure.

In an embodiment, referring to FIG. 5, FIG. 5 is a schematic structural diagram of a device for diagnosing a motor parameter according to another embodiment of the present disclosure. FIG. 5 is obtained by further optimization based on FIG. 4. As shown in FIG. 5, based on FIG. 4, a functional core 15 is added. The functional core 15 may be connected with the second processing unit 16.

The second processing unit 16 is further configured to perform an optimal calculation on the first motor angle, to obtain a more accurate second motor angle, and send the second motor angle to the functional core 15.

The functional core 15 may be a chip configured to implement a specific function. The functional core 15 can implement some specific functions of the vehicle. Specifically, the functional core 15 can realize automatic control of a motor speed of the vehicle based on the second motor angle.

Figure 6:
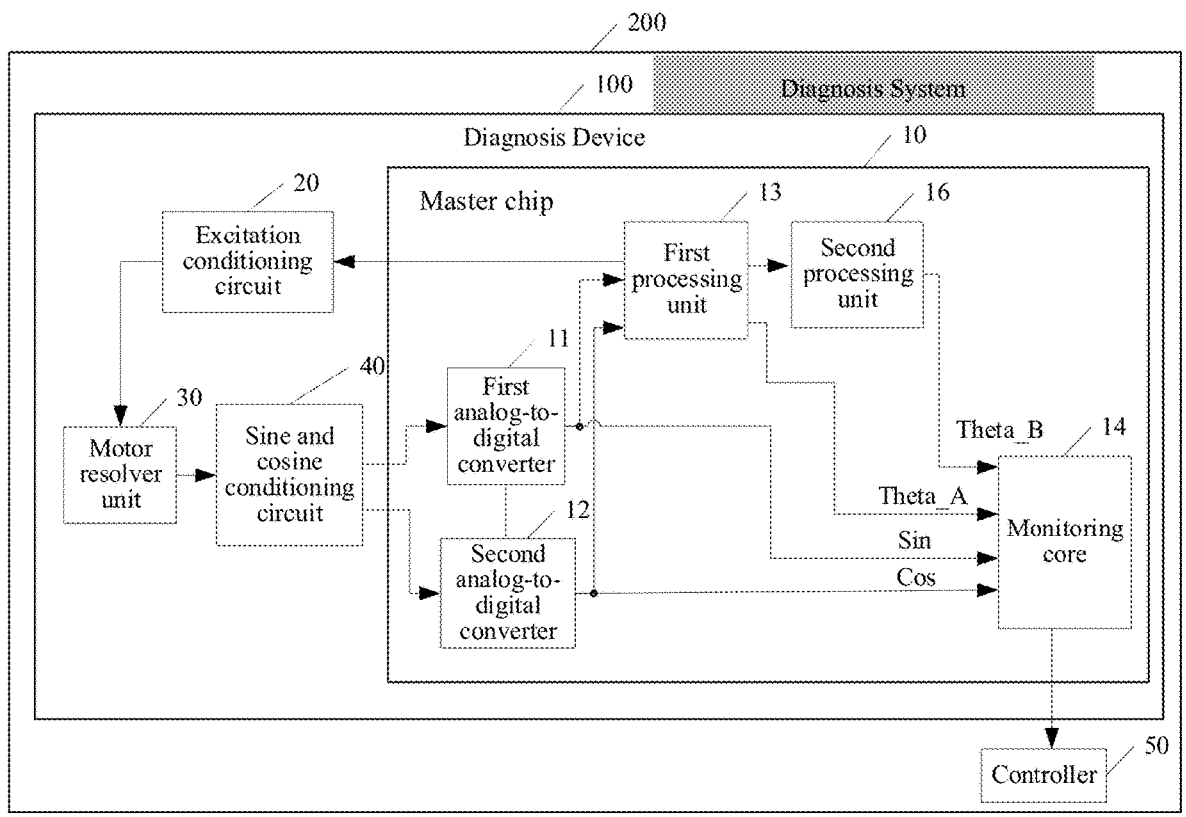
FIG. 6 is a schematic structural diagram of a system for diagnosing a motor parameter according to an embodiment of the present disclosure.

Referring to FIG. 6, FIG. 6 is a schematic structural diagram of a system for diagnosing a motor parameter according to an embodiment of the present disclosure. As shown in FIG. 6, the system 200 for diagnosing a motor parameter includes a controller 50 and the device 100 for diagnosing a motor parameter shown in FIG. 4. The controller 50 is configured to stop the operation of the motor in a case that the sine digital signal is abnormal, the cosine digital signal is abnormal, or the first motor angle is abnormal.

When the monitoring core 14 diagnoses that the second motor angle is abnormal, the monitoring core 14 may transmit an abnormal signal to the controller 50, and the controller 50 may process the abnormality based on the abnormal signal. In this way, performance of the safety control is improved, and a desirable single-point-of-failure coverage is realized, thereby avoiding a common cause failure.

The controller 50 may be an executive device, that is, a device with an execute permission. Execution of operations by the executive device is easily affected by the motor parameter, and the abnormality of the motor parameter may bring a safety risk to the execution of the operations by the executive device.

The system for diagnosing a motor parameter shown in FIG. 6 is applicable to a vehicle system.

In an embodiment, the system for diagnosing a motor parameter shown in FIG. 6 may include a controller 50 and the device 100 for diagnosing a motor parameter shown in FIG. 5.

In this embodiment of the present disclosure, the first motor angle is calculated by the first processing unit, and the first motor angle is diagnosed by the monitoring core. Therefore, the calculation and the diagnosis of the first motor angle are performed separately. Since the angle calculation and the angle diagnosis can be executed independently, an execution speed is improved. The monitoring core may diagnose the sine digital signal, the cosine digital signal, and the first motor angle, to realize comprehensive diagnosis of key parameters (the sine digital signal, the cosine digital signal, and the first motor angle) of a motor, thereby improving the diagnosis accuracy of the motor parameter. Once an abnormal parameter is detected, the abnormality is processed quickly, thereby improving the reliability of the safety control.

In the foregoing embodiments, the descriptions of each embodiment have different focuses, and for a part that is not described in detail in an embodiment, reference may be made to the relevant description of other embodiments.

In the embodiments provided in the present disclosure, it should be understood that the disclosed apparatus may be implemented in other manners. For example, the apparatus embodiment described above is merely a schematic embodiment. For example, the division of units is merely a division of logical functions, and division manners may be used in actual implementation. For example, multiple units or components may be combined or integrated into another system, or some features may be ignored or not performed. In addition, the displayed or discussed mutual couplings or direct couplings or communication connections may be implemented by some interfaces, and indirect couplings or communication connections between apparatuses or units which may be electric or in other forms.

The units described as separate parts may or may not be physically separate. Parts displayed as units may or may not be physical units, and may be located at one position, or may be distributed on a plurality of network units. Some or all of the units may be selected according to actual requirements to achieve the objectives of the solutions of the embodiments.

In addition, functional units in the embodiments of the present disclosure may be integrated into one processing unit, or each of the units may be physically separated, or two or more units may be integrated into one unit. The foregoing integrated unit may be implemented in a form of hardware, or may be implemented in a form of a software program module.

The embodiments of the present disclosure are described in detail above. The principles and implementations of the present disclosure are described through specific examples in this specification, and the descriptions of the embodiments are only intended to help understand the methods and core ideas of the present disclosure. Meanwhile, a person of ordinary skill in the art may make modifications to the specific implementations and application scopes according to the ideas of the present disclosure. In conclusion, the content of the specification does not limit the present disclosure.

What is claimed is:

1. A diagnosis device, comprising a master chip, an excitation conditioning circuit, a motor resolver, and an analog signal conditioning circuit, wherein the master chip comprises a first analog-to-digital converter, a second analog-to-digital converter, a first processor, and a monitoring core;

the first processor is configured to send an excitation signal to the motor resolver through the excitation conditioning circuit;

the motor resolver is configured to generate a sine analog signal and a cosine analog signal based on the excitation signal;

the analog signal conditioning circuit is configured to process the sine analog signal and output a processed sine analog signal to the first analog-to-digital converter, and to process the cosine analog signal and output a processed cosine analog signal to the second analog-to-digital converter;

the first analog-to-digital converter is configured to convert the processed sine analog signal to a sine digital signal and to send the sine digital signal to the first processor and the monitoring core;

the second analog-to-digital converter is configured to convert the processed cosine analog signal to a cosine digital signal and to send the cosine digital signal to the first processor and the monitoring core;

the first processor is configured to obtain a first motor angle based on the sine digital signal and the cosine digital signal and send the first motor angle to the monitoring core; and the monitoring core is configured to detect whether a first difference between the sine digital signal and a preset sine digital signal threshold falls within a range of a sine signal diagnosis threshold, whether a second difference between the cosine digital signal and a preset cosine digital signal threshold falls within a range of a cosine signal diagnosis threshold, and whether a third difference between the first motor angle and a preset angle threshold falls within a range of an angle diagnosis threshold; and wherein each of the sine signal diagnosis threshold, the cosine signal diagnosis threshold, and the angle diagnosis threshold is determined based on at least one of a model of the motor, a model of a vehicle, or a scene where the vehicle is located.

2. The device according to claim 1, wherein the monitoring core is further configured to receive a revision instruction of a sine signal threshold, to receive information of the sine signal diagnosis threshold inputted by a user, and to revise the range of the sine signal diagnosis threshold according to the information of the sine signal diagnosis threshold.

3. The device according to claim 1, wherein the monitoring core is further configured to receive a revision instruction of a cosine signal threshold, to receive information of the cosine signal diagnosis threshold inputted by a user, and to revise the range of the cosine signal diagnosis threshold according to the information of the cosine signal diagnosis threshold.

4. The device according to claim 1, wherein the monitoring core is further configured to receive a revision instruction of an angle threshold, to receive information of the angle diagnosis threshold inputted by a user, and to revise the range of the angle diagnosis threshold according to the information of the angle diagnosis threshold.

5. The device according to claim 1, further comprising a second processor, wherein the first processor is further configured to send the first motor angle to the second processor after obtaining the first motor angle;

the second processor is configured to perform an optimal calculation on the first motor angle to obtain a second motor angle and send the second motor angle to the monitoring core; and the monitoring core is further configured to diagnose the second motor angle to detect whether the second motor angle is abnormal.

6. The device according to claim 5, wherein diagnosing the second motor angle by the monitoring core to detect whether the second motor angle is abnormal comprises:

detecting, by the monitoring core, whether a fourth difference between the second motor angle and the preset angle threshold falls within the range of the angle diagnosis threshold; and in response to that the fourth difference does not fall within the range of the angle diagnosis threshold, determining that the second motor angle is abnormal.

7. The device according to claim 1, wherein the monitoring core is further configured to obtain a third motor angle based on the sine digital signal and the cosine digital signal; and diagnosing the first motor angle by the monitoring core to detect whether the first motor angle is abnormal comprises:

detecting, by the monitoring core, whether a fifth difference between the first motor angle and the third motor angle falls within a range of an angle diagnosis threshold, and in response to that the fifth difference does not fall within the range of the angle diagnosis threshold, determining that the first motor angle is abnormal.

8. A diagnosis system, comprising a controller and a diagnosis device, wherein the diagnosis device comprises a master chip, an excitation conditioning circuit, a motor resolver, and an analog signal conditioning circuit, wherein the master chip comprises a first analog-to-digital converter, a second analog-to-digital converter, a first processor, and a monitoring core;

the first processor is configured to send an excitation signal to the motor resolver through the excitation conditioning circuit;

the motor resolver is configured to generate a sine analog signal and a cosine analog signal based on the excitation signal;

the analog signal conditioning circuit is configured to process the sine analog signal and output a processed sine analog signal to the first analog-to-digital converter, and to process the cosine analog signal and output a processed cosine analog signal to the second analog-to-digital converter;

the first analog-to-digital converter is configured to convert the processed sine analog signal to a sine digital signal and to send the sine digital signal to the first processor and the monitoring core;

the second analog-to-digital converter is configured to convert the processed cosine analog signal to a cosine digital signal and to send the cosine digital signal to the first processor and the monitoring core;

the first processor is configured to obtain a first motor angle based on the sine digital signal and the cosine digital signal and send the first motor angle to the monitoring core;

the monitoring core is configured to diagnose the sine digital signal is abnormal if a first difference between the sine digital signal and a preset sine digital signal threshold falls outside of a range of a sine signal diagnosis threshold, to diagnose the cosine digital signal is abnormal if a second difference between the cosine digital signal and a preset cosine digital signal threshold falls outside of a range of a cosine signal diagnosis threshold, and to diagnose the first motor angle is abnormal if a third difference between the first motor angle and a preset angle threshold falls outside of a range of an angle diagnosis threshold; and the controller is configured to stop an operation of a motor in response to that the sine digital signal is abnormal, the cosine digital signal is abnormal, or the first motor angle is abnormal; and wherein each of the sine signal diagnosis threshold, the cosine signal diagnosis threshold, and the angle diagnosis threshold is determined based on at least one of a model of a motor, a model of a vehicle, or a scene where the vehicle is located.

9. The system according to claim 8, wherein the monitoring core is further configured to receive a revision instruction of a sine signal threshold, to receive information of the sine signal diagnosis threshold inputted by a user, and to revise the range of the sine signal diagnosis threshold according to the information of the sine signal diagnosis threshold.

10. The system according to claim 8, wherein the monitoring core is further configured to receive a revision instruction of a cosine signal threshold, to receive information of the cosine signal diagnosis threshold inputted by a user, and to revise the range of the cosine signal diagnosis threshold according to the information of the cosine signal diagnosis threshold.

11. The system according to claim 8, wherein the monitoring core is further configured to receive a revision instruction of an angle threshold, to receive information of the angle diagnosis threshold inputted by a user, and to revise the range of the angle diagnosis threshold according to the information of the angle diagnosis threshold.

12. The system according to claim 8, further comprising a second processor, wherein
the first processor is further configured to send the first motor angle to the second processor after obtaining the first motor angle;
the second processor is configured to perform an optimal calculation on the first motor angle to obtain a second motor angle and send the second motor angle to the monitoring core; and
the monitoring core is further configured to diagnose the second motor angle to detect whether the second motor angle is abnormal.

13. The system according to claim 12, wherein diagnosing the second motor angle by the monitoring core to detect whether the second motor angle is abnormal comprises:
detecting, by the monitoring core, whether a fourth difference between the second motor angle and the preset angle threshold falls within the range of the angle diagnosis threshold; and in response to that the fourth difference does not fall within the range of the angle diagnosis threshold, determining that the second motor angle is abnormal.

14. The system according to claim 8, wherein
the monitoring core is further configured to obtain a third motor angle based on the sine digital signal and the cosine digital signal; and
diagnosing the first motor angle by the monitoring core to detect whether the first motor angle is abnormal comprises:
detecting, by the monitoring core, whether a fifth difference between the first motor angle and the third motor angle falls within a range of an angle diagnosis threshold, and in response to that the fifth difference does not fall within the range of the angle diagnosis threshold, determining that the first motor angle is abnormal.

15. A diagnosis device, comprising a master chip, an excitation conditioning circuit, a motor resolver, and an analog signal conditioning circuit, wherein
the master chip comprises a first analog-to-digital converter, a second analog-to-digital converter, a first processor, and a monitoring core;
the first processor is configured to send an excitation signal to the motor resolver through the excitation conditioning circuit;
the motor resolver is configured to generate a sine analog signal and a cosine analog signal based on the excitation signal;
the analog signal conditioning circuit is configured to process the sine analog signal and output a processed sine analog signal to the first analog-to-digital converter, and to process the cosine analog signal and output a processed cosine analog signal to the second analog-to-digital converter;
the first analog-to-digital converter is configured to convert the processed sine analog signal to a sine digital signal and to send the sine digital signal to the first processor and the monitoring core;
the second analog-to-digital converter is configured to convert the processed cosine analog signal to a cosine digital signal and to send the cosine digital signal to the first processor and the monitoring core;
the first processor is configured to obtain a first motor angle based on the sine digital signal and the cosine digital signal and send the first motor angle to the monitoring core; and
the monitoring core is configured to diagnose the sine digital signal to detect whether the sine digital signal is abnormal, to diagnose the cosine digital signal to detect whether the cosine digital signal is abnormal, and to diagnose the first motor angle to detect whether the first motor angle is abnormal; and
wherein diagnosing the sine digital signal by the monitoring core to detect whether the sine digital signal is abnormal comprises:
detecting, by the monitoring core, whether a first difference between the sine digital signal and a preset sine digital signal threshold falls within a range of a sine signal diagnosis threshold; and in response to that the first difference does not fall within the range of the sine signal diagnosis threshold, determining that the sine digital signal is abnormal;
diagnosing the cosine digital signal by the monitoring core to detect whether the cosine digital signal is abnormal comprises:
detecting, by the monitoring core, whether a second difference between the cosine digital signal and a preset cosine digital signal threshold falls within a range of a cosine signal diagnosis threshold; and in response to that the second difference does not fall within the range of the cosine signal diagnosis threshold, determining that the cosine digital signal is abnormal;
diagnosing the first motor angle by the monitoring core to detect whether the first motor angle is abnormal comprises:
detecting, by the monitoring core, whether a third difference between the first motor angle and a preset angle threshold falls within a range of an angle diagnosis threshold, and in response to that the third difference does not fall within the range of the angle diagnosis threshold, determining that the first motor angle is abnormal; and
wherein the monitoring core is further configured to receive a revision instruction of an angle threshold, to receive information of the angle diagnosis threshold inputted by a user, and to revise the range of the angle diagnosis threshold according to the information of the angle diagnosis threshold.

16. The device according to claim 15, further comprising a second processor, wherein the first processor is further configured to send the first motor angle to the second processor after obtaining the first motor angle;

the second processor is configured to perform an optimal calculation on the first motor angle to obtain a second motor angle and send the second motor angle to the monitoring core; and the monitoring core is further configured to diagnose the second motor angle to detect whether the second motor angle is abnormal.

17. The device according to claim 16, wherein diagnosing the second motor angle by the monitoring core to detect whether the second motor angle is abnormal comprises:

detecting, by the monitoring core, whether a fourth difference between the second motor angle and the preset angle threshold falls within the range of the angle diagnosis threshold; and in response to that the fourth difference does not fall within the range of the angle diagnosis threshold, determining that the second motor angle is abnormal.

18. The device according to claim 15, wherein the monitoring core is further configured to obtain a third motor angle based on the sine digital signal and the cosine digital signal; and diagnosing the first motor angle by the monitoring core to detect whether the first motor angle is abnormal comprises:

detecting, by the monitoring core, whether a fifth difference between the first motor angle and the third motor angle falls within a range of an angle diagnosis threshold, and in response to that the fifth difference does not fall within the range of the angle diagnosis threshold, determining that the first motor angle is abnormal.

* * * * *